United States Patent

Murray, Sr. et al.

[11] Patent Number: 6,159,663
[45] Date of Patent: Dec. 12, 2000

[54] METHOD OF CREATING A SOLDERABLE METAL LAYER ON GLASS OR CERAMIC

[75] Inventors: James R. Murray, Sr., Cortial; Burhan Osmat, Vorheesville, both of N.Y.

[73] Assignee: Intersil Corporation, Palm Bay, Fla.

[21] Appl. No.: 09/107,475

[22] Filed: Jun. 30, 1998

[51] Int. Cl.[7] ................................ G03F 7/00
[52] U.S. Cl. .................... 430/318; 430/313; 134/2; 216/41; 216/103; 427/96
[58] Field of Search ................. 430/311, 318, 430/313; 427/96, 126.2; 216/41, 102, 103, 108; 134/2, 3, 36, 41

[56] References Cited

U.S. PATENT DOCUMENTS

| | | | |
|---|---|---|---|
| 3,767,398 | 10/1973 | Morgan | 430/318 |
| 4,122,215 | 10/1978 | Vratny | 427/92 |
| 4,423,137 | 12/1983 | Rester | 430/318 |
| 5,141,829 | 8/1992 | Dumas et al. | 430/313 |
| 5,169,680 | 12/1992 | Ting et al. | 427/96 |
| 5,308,745 | 5/1994 | Schwartzkopf | 430/311 |
| 5,358,826 | 10/1994 | Steitz et al. | 430/318 |

*Primary Examiner*—Kathleen Duda
*Attorney, Agent, or Firm*—Rogers & Killeen

[57] ABSTRACT

A method for creating a solderable metal layer on a ceramic, glass, or glass ceramic member is described. The described method deposits an aluminum containing mixture on the member by ion vapor deposition creating a metalized ceramic member. A photoresist is applied to the metalized ceramic member. A photomask is applied to the photoresist and the photoresist is exposed to light. After the photomask and exposed photoresist are stripped off, the underlying aluminum containing mixture is removed with an etchant. The remaining photoresist is removed and a metal corrosion inhibiting layer is deposited on the remaining aluminum containing mixture. A solderable layer is then deposited on the metal corrosion inhibiting layer.

20 Claims, 1 Drawing Sheet

METHOD OF CREATING A SOLDERABLE METAL LAYER ON GLASS OR CERAMIC

BACKGROUND OF THE INVENTION

The invention relates to a method of creating a solderable metal layer on a ceramic, glass, or glass ceramic member.

A layer of an aluminum containing mixture is deposited on the ceramic, glass, or glass ceramic member by ion vapor deposition creating a metalized ceramic member. The aluminum containing mixture is cleaned, dried, and heated and a photoresist is placed on the aluminum. A photomask is place on the photoresist and the exposed portions of the photoresist are exposed to a light source. The photomask is removed and the portions of the photoresist that were exposed to the light source is stripped off to selectively expose the underlying aluminum containing mixture. The selectively exposed aluminum containing mixture is removed with an aluminum etchant exposing the underlying ceramic, glass, or glass ceramic member. The remaining portions of the photoresist are stripped off exposing the remaining aluminum containing mixture. The remaining aluminum containing mixture is plated with a metal corrosion barrier. The metal corrosion barrier is then plated with a solderable layer.

The resulting structure provides solderable and adherent metal layers with high ductility and high electrical and thermal conductivities. Devices fabricated using the disclosed method are required by modern microelectronics packages consisting of discrete semiconductor power devices or power modules having multiple semiconductor power devices. There are myriad applications for devices fabricated with the disclosed method such as lid arrays for discrete power devices and thermal bases of multi power device modules.

Such devices improve the cost, performance, yield, and reliability of metalized ceramic members.

Accordingly, it is an object of the present invention to provide a novel method for fabricating a solderable layer on a metalized ceramic, glass, or glass ceramic member.

It is another object of the present invention to provide a novel method for creating a solderable layer on a metalized ceramic, glass, or glass ceramic member on the top, bottom, and through holes of the member.

It is yet another object of the present invention to provide a novel method for creating solderable layers on a metalized ceramic, glass, or glass ceramic member that provide high ductility, high electrical conductivity, and high thermal conductivity.

It is still another object of the present invention to provide a novel method for creating solderable layers on a metalized ceramic, glass, or glass ceramic member that improves the cost, performance, yield, and reliability of metalized ceramic, glass, or glass ceramic members.

These and many other objects and advantages of the present invention will be readily apparent to one skilled in the art to which the invention pertains from a perusal of the claims, the appended drawing, and the following detailed description of the preferred embodiments.

DESCRIPTION OF PREFERRED EMBODIMENTS

Figure 1:
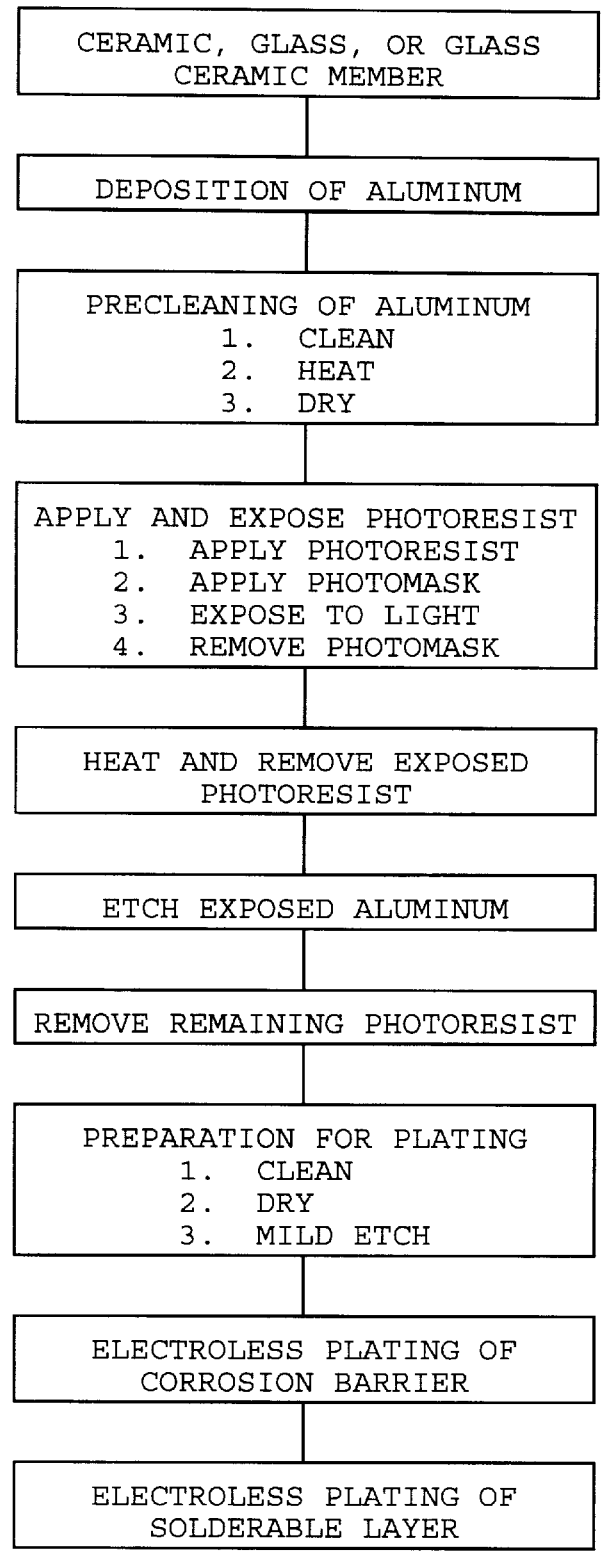
FIG. 1 is a flow chart indicating the steps for creating a solderable layer on aluminum deposited on a ceramic, glass, or glass ceramic member.

FIG. 1 shows the steps required to perform the invention in one embodiment of the invention.

As an illustrative example, a ceramic member is coated with a layer of aluminum by ion vapor deposition. The aluminum layer is typically 2 mils to 2.5 mils thick in order to be able to carry the required electrical current, for example in a microelectronics package. The aluminum layer mixture could also have a thickness of at least 2 mils in other examples.

The aluminum layer is then cleaned, heated, and dried to ensure proper application of the photoresist to the aluminum layer. The aluminum is cleaned with a cleanser and scrub brush to remove aluminum oxide. The aluminum is then rinsed with water. This cleaning and rinsing is repeated until the water ceases to bead on the aluminum surface indicating that the aluminum oxide has been removed. Removal of aluminum oxide is important to maximize the free energy of the aluminum surface to assure proper wetting and bonding of the photoresist. The aluminum is then dried to prevent the formation of water spots or the aluminum surface and then heated at 75° C. for approximately 15 minutes to ensure even heating across the aluminum surface in preparation for the application of a photoresist.

A photoresist, such as a dry film photoresist approximately 1.5 mils thick, can be applied to the aluminum layer. The dry film photoresist could be applied to the aluminum layer at a pressure greater than atmospheric pressure. A photomask is applied on the photoresist to mask selected portions of the exposed surface of the photoresist film. The aluminum-layered ceramic member with the photoresist and photomask is exposed to a negative pressure of at least 20 in. Hg to ensure that the photomask is tightly held to the photoresist. While maintaining the negative pressure of at least 20 in. Hg., the unmasked portions of the photoresist are exposed to an ultraviolet ("UV") light source until a light intensity of 30 light units (3,000 lumens) is achieved. After exposure of the unmasked portions of the photoresist to a UV light source, the negative pressure is removed and the photomask is separated from the photoresist.

The photoresist is then hard baked by heating the photoresist at 95° C.±3° C. for approximately 30 minutes. This hard baking is essential to increase the toughness and the chemical resistance of the portions of the photoresist that were not exposed to the UV light source so that the non UV-exposed portions of the photoresist can withstand the abrasiveness of the aluminum etchant. Without hard baking, the non UV-exposed portions of the photoresist may be degraded by the aluminum etchant acids thereby causing unwanted removal of the aluminum layer under the non UV-exposed photoresist. The portions of the photoresist that were exposed to the UV light source are removed by immersion in an aqueous developing solution until the UV-exposed photoresist is removed, approximately 2 to 3 minutes in duration.

The exposed aluminum layer is etched with an aluminum etchant consisting of phosphoric acid, nitric acid, and acetic acid for approximately 45 minutes, depending on the thickness of the aluminum layer, to selectively remove the aluminum to expose the ceramic member. Where the design tolerances for the finished product require precise etching, spray etching of the aluminum layer is preferred to immersion etching to minimize undercut removal of the aluminum layer under the non UV-exposed photoresist. The exposed ceramic member is then rinsed with water to remove any excess etchant. When spray etching is utilized the exposed surface of the member could be rinsed in water for at least two minutes.

The remaining photoresist is removed by immersing the photoresist into an alkaline photoresist stripping solution for approximately five minutes to expose the remaining aluminum.

The remaining aluminum is then cleaned and dried in a similar fashion as during preparation for applying the photoresist. The remaining aluminum is cleaned with a cleanser and scrub brush to remove aluminum oxide. The remaining aluminum is then rinsed with water. This cleaning and rinsing is repeated until the water ceases to bead on the remaining aluminum surface indicating that the aluminum oxide has been removed. Removal of aluminum oxide is important to maximize the free energy of the remaining aluminum surface to assure proper deposition of a metallic corrosion inhibiting layer. The remaining aluminum is then dried to prevent the formation of water spots on the remaining aluminum surface and then cleaned with acetone to remove any remaining residue from the remaining aluminum surface. The cleaning with acetone could also be in an agitated bath of acetone for 3 minutes.

The remaining aluminum is then inserted in an agitated acid bath of 3% hydrochloric acid, 3% nitric acid, and 94% demineralized water for approximately 3 minutes to remove any remaining contaminants and to lightly roughen the surface of the remaining aluminum in preparation for plating of a metal corrosion barrier to the surface of the remaining aluminum.

A metal corrosion barrier is then plated on the remaining aluminum to prevent the aluminum from reacting with a later-applied solderable layer of gold or silver. A typical metal corrosion barrier consists of nickel but any metal that does not react with the solderable barrier can be applied.

One useful method of applying a corrosion barrier of nickel to the remaining aluminum is to immerse the remaining aluminum in an electroless nickel plating solution for approximately 20 minutes. Electroless deposition of the metal corrosion barrier eliminates the need to have the remaining aluminum electrically connected. The metal corrosion barrier surface is then rinsed with demineralized water. Demineralized water is used to minimize the occurrence of any residual minerals on the surface of the metal corrosion barrier. The presence of minerals on the metal corrosion barrier will impair the adhesion of the solderable layer to the corrosion barrier. Rinsing with non-demineralized water is acceptable as long as any residual minerals are removed before plating the metal corrosion barrier with the solderable layer.

A solderable layer is then plated on the metal corrosion barrier. A typical solderable layer consists of either gold or silver.

One useful method of applying a solderable layer of gold to the metal corrosion barrier is to immerse the metal corrosion barrier in an electroless gold plating solution for approximately 30 minutes. Electroless deposition of the solderable layer eliminates the need to have the metal corrosion barrier electrically connected. The solderable layer is rinsed with demineralized water and dried.

While preferred embodiments of the present invention have been described, it is to be understood that the embodiments described are illustrative only and the scope of the invention is to be defined solely by the appended claims when accorded a full range of equivalence, many variations arid modifications naturally occurring to those of skill in the art from a perusal hereof.

What is claimed is:

1. A method of creating a solderable metal layer on an exposed surface of a ceramic, glass, or glass ceramic member comprising the steps of:
   (a) providing a ceramic, glass, or glass ceramic member having an exposed surface to receive a solderable layer;
   (b) applying by ion vapor deposition an aluminum containing mixture film on the exposed surface of the member to thereby provide an aluminum containing mixture surface;
   (c) applying a dry film photoresist to the aluminum containing mixture surface to thereby provide a photoresist film;
   (d) applying a photomask to the photoresist film to thereby mask selected portions of the photoresist film;
   (e) exposing the unselected portions of the photoresist film to ultraviolet light;
   (f) removing the photomask to thereby expose the selected portions of the photoresist film;
   (g) heating the photoresist film;
   (h) removing the unselected portions of the photoresist film to thereby selectively expose the aluminum containing mixture surface;
   (i) etching the exposed aluminum containing mixture surface to remove the exposed aluminum containing mixture and thereby selectively expose the surface of the member;
   (j) removing the remaining photoresist film to expose the remaining aluminum containing mixture surface;
   (k) plating of a corrosion inhibiting metal to the remaining aluminum containing mixture surface to thereby provide a corrosion barrier between the aluminum containing mixture and any subsequently applied solderable metal; and
   (l) plating of a solderable metal to the corrosion barrier to thereby create a solderable metal layer on the member.

2. The method of claim 1, wherein the aluminum containing mixture surface in step (b) is prepared for the application of photoresist in step (c) by:
   (A) cleaning the aluminum containing mixture surface to reduce the amount of aluminum oxide; and
   (B) heating the aluminum containing mixture surface.

3. The method of claim 2, wherein the cleaning of the aluminum containing mixture surface in step (A) comprises the following steps:
   (I) cleaning the aluminum containing mixture surface with a cleanser using a brass scrub brush;
   (II) thoroughly rinsing the aluminum containing mixture surface with water;
   (III) repeating steps (I) and (II) until the water ceases to bead on the aluminum containing mixture surface; and
   (IV) drying the aluminum containing mixture surface to reduce the formation of water spots on the aluminum containing mixture surface.

4. The method of claim 2, wherein the aluminum containing mixture surface in step (B) is heated at 75° C. for 15 minutes.

5. The method of claim 1, wherein the aluminum containing mixture film in step (b) is at least 2 mils thick.

6. The method of claim 1, wherein applying the dry film photoresist to the aluminum containing mixture surface in step (c) occurs at a pressure greater than atmospheric pressure to provide a photoresist film approximately 1.5 mils thick.

7. The method of claim 1, wherein exposing the portions of the photoresist film which are not masked in step (e) comprises the following steps:
   (A) exposing the portions of the photoresist film which are not masked to a negative pressure of at least 20 in. Hg.; and (B) exposing the portions of the photoresist film which are not masked to an ultraviolet light source for 30 light units while maintaining the negative pressure of at least 20 in. Hg.

8. The method of claim 1, wherein the photoresist film in step (g) is heated at 95° C.±3° C. for approximately 30 minutes.

9. The method of claim 1, wherein the removing of the ultraviolet exposed portions of the photoresist film to selectively expose the aluminum containing mixture surface in step (h) occurs by exposure of the ultraviolet exposed portions of the photoresist film to an aqueous developing solution.

10. The method of claim 1, wherein etching the exposed aluminum containing mixture surface in step (i) occurs by spray etching the expose aluminum containing mixture surface with an aluminum etchant consisting of phosphoric acid, nitric acid, and acetic acid for approximately 45 minutes.

11. The method of claim 1, wherein removing the remaining photoresist film in step (j) occurs by inserting the remaining photoresist film into an alkaline photoresist stripping solution.

12. The method of claim 1, wherein the remaining aluminum containing mixture surface in step (j) is prepared for plating of a corrosion inhibiting metal in step (k) by:
(A) cleaning the remaining aluminum containing mixture surface to reduce the amount of aluminum oxide; and
(B) mild etching of the remaining aluminum containing mixture surface.

13. The method of claim 12, wherein the cleaning of the remaining aluminum containing mixture surface in step (A) comprises the following steps:
(I) cleaning the remaining aluminum containing mixture surface with a cleanser using a brass scrub brush;
(II) thoroughly rinsing the remaining aluminum containing mixture surface with water;
(III) repeating steps (I) and (II) until the water ceases to bead on the remaining aluminum containing mixture surface; and
(IV) drying the remaining aluminum containing mixture surface to reduce the formation of water spots on the remaining aluminum containing mixture surface.

14. The method of claim 12, wherein the mild etching of the remaining aluminum containing mixture surface in step (B) comprises the following steps:
(I) cleaning the remaining aluminum containing mixture surface in an agitated bath of acetone for 3 minutes; and
(II) inserting the remaining aluminum containing mixture surface into an agitated acid bath of 3% hydrochloric acid, 3% nitric acid, and 94% demineralized water for 3 minutes.

15. The method of claim 1, wherein the plating of a corrosion inhibiting metal to the remaining aluminum containing mixture surface in step (k) comprises the following steps:
(A) rinsing the remaining aluminum containing mixture surface in a demineralized water bath for 3 minutes; and
(B) applying a nickel film on the remaining aluminum containing mixture surface by immersing the remaining aluminum containing mixture surface in an electroless nickel plating solution for approximately 20 minutes to thereby provide a corrosion barrier between the aluminum containing mixture and any subsequently applied solderable metal in step (l).

16. The method of claim 1, wherein the plating of a solderable metal to the corrosion barrier in step (l) comprises the following steps:
(A) rinsing the corrosion barrier in a demineralized water bath;
(B) applying a gold film on the corrosion barrier by immersing the corrosion barrier in an electroless gold plating solution for approximately 30 minutes to thereby provide a solderable metal layer.

17. The method of claim 1, wherein said aluminum containing mixture is aluminum.

18. A method of creating a solderable metal layer on an exposed surface of a ceramic, glass, or glass ceramic member comprising the steps of:
(a) providing a ceramic, glass, or glass ceramic member having an exposed surface to receive a solderable layer;
(b) applying an aluminum containing mixture film to a thickness of at least 2 mils on a surface of the member by ion vapor deposition to thereby provide an aluminum containing mixture surface;
(c) cleaning and drying the aluminum containing mixture surface by
(i) cleaning the aluminum containing mixture surface with a cleanser using a brass scrub brush,
(ii) thoroughly rinsing the aluminum containing mixture surface with water,
(iii) repeating steps (i) and (ii) until the water ceases to bead on the aluminum containing mixture surface,
(iv) drying the aluminum containing mixture surface to reduce the formation of water spots on the aluminum containing mixture surface;
(d) heating the aluminum containing mixture surface at 75° C. for 15 minutes;
(e) applying a dry film photoresist to the aluminum containing mixture surface at a pressure greater than atmospheric pressure to provide a photoresist film approximately 1.5 mils thick;
(f) applying a photomask to the photoresist film to thereby mask selected portions of the photoresist film;
(g) exposing the unselected portions of the photoresist film to a negative pressure of at least 20 in. Hg;
(h) exposing the unselected portions of the photoresist film to an ultraviolet light source for 30 light units while maintaining the negative pressure of at least 20 in. Hg;
(i) removing the photomask to thereby expose the selected portions of the photoresist film;
(j) heating the photoresist film at 95° C.±3° C. for approximately 30 minutes;
(k) removing the unselected portions of the photoresist film by exposure of the unselected portions of the photoresist film to an aqueous developing solution for 2 to 3 minutes for selectively exposing the aluminum containing mixture surface;
(l) spray etching the exposed aluminum containing mixture surface with an aluminum etchant consisting of phosphoric acid, nitric acid, and acetic acid for approximately 45 minutes to remove the exposed aluminum containing mixture and thereby selectively expose the surface of the member;
(m) rinsing the exposed surface of the member in water for at least 2 minutes;
(n) removing the remaining photoresist film by inserting the remaining photoresist film into a bath of alkaline photoresist stripping solution for approximately 5 minutes;

(o) cleaning and drying the remaining aluminum containing mixture surface by
   (A) cleaning the remaining aluminum containing mixture surface with a cleanser using a brass scrub brush,
   (B) thoroughly rinsing the remaining aluminum containing mixture surface with water,
   (C) repeating steps (A) and (B) until the water ceases to bead on the remaining aluminum containing mixture surface,
   (D) drying the remaining aluminum containing mixture surface to reduce the formation of water spots on the remaining aluminum containing mixture surface,
   (E) cleaning the remaining aluminum containing mixture surface in an agitated bath of acetone for 3 minutes,
   (F) inserting the remaining aluminum containing mixture surface into an acid bath of 3% hydrochloric acid, 3% nitric acid, and 94% demineralized water for 3 minutes;

(p) electroless plating of nickel and gold to the remaining aluminum containing mixture surface by:
   (1) rinsing the remaining aluminum containing mixture surface in a demineralized water bath for 3 minutes,
   (2) applying a nickel film on the aluminum containing mixture surface by immersing the aluminum containing mixture surface in an electroless nickel plating solution for approximately 20 minutes to thereby provide a nickel surface,
   (3) rinsing the nickel surface in a demineralized water bath for several minutes,
   (4) applying a gold film on the nickel surface by immersing the nickel surface in an electroless gold plating solution for approximately 30 minutes to thereby provide a gold surface,
   (5) rinsing the gold surface in a demineralized water bath for several mninutes;

(q) drying the gold surface to prevent the formation of water spots on the gold surface to thereby create a solderable metal layer.

19. The method of claim 18, wherein said aluminum containing mixture is aluminum.

20. A method of creating a solderable metal layer on a ceramic, glass, or glass ceramic member comprising the steps of:
   (a) providing a ceramic, glass, or glass ceramic member;
   (b) applying aluminum to a surface of the member by ion vapor deposition;
   (c) applying a photoresist to the aluminum;
   (d) applying a photomask to the photoresist;
   (e) exposing the photoresist film to a light source;
   (f) removing the photomask;
   (g) heating the photoresist;
   (h) removing the exposed photoresist;
   (i) removing the exposed aluminum;
   (j) removing the remaining photoresist;
   (k) plating of a corrosion inhibiting metal to the aluminum; and
   (l) plating of a solderable metal to the corrosion-inhibiting metal to thereby create a solderable layer.

\* \* \* \* \*